United States Patent
Dubuc

(10) Patent No.: US 10,222,036 B2
(45) Date of Patent: Mar. 5, 2019

(54) METHOD AND SYSTEM FOR A THREE-DIMENSIONAL (3-D) FLEXIBLE LIGHT EMITTING DIODE (LED) BAR

(71) Applicant: GE Lighting Solutions, LLC, East Cleveland, OH (US)

(72) Inventor: Eden Dubuc, Lachine (CA)

(73) Assignee: GE Lighting Solutions, LLC, East Cleveland, OH (US)

( * ) Notice: Subject to any disclaimer, the term of this patent is extended or adjusted under 35 U.S.C. 154(b) by 0 days.

(21) Appl. No.: 14/836,983

(22) Filed: Aug. 27, 2015

(65) Prior Publication Data

US 2017/0059140 A1    Mar. 2, 2017

(51) Int. Cl.

| | | |
|---|---|---|
| *F21V 19/00* | (2006.01) | |
| *F21S 4/00* | (2016.01) | |
| *H05K 1/02* | (2006.01) | |
| *H05K 1/18* | (2006.01) | |
| *F21S 4/22* | (2016.01) | |
| *F21K 9/90* | (2016.01) | |
| *F21Y 115/10* | (2016.01) | |

(52) U.S. Cl.
CPC .............. *F21V 19/005* (2013.01); *F21K 9/90* (2013.01); *F21S 4/22* (2016.01); *H05K 1/028* (2013.01); *H05K 1/189* (2013.01); *F21Y 2115/10* (2016.08); *H05K 1/0278* (2013.01); *H05K 2201/10106* (2013.01)

(58) Field of Classification Search
CPC .. F21V 19/005; F21K 9/90; F21S 4/20; F21S 4/22; F21S 4/24; F21S 4/28; F21Y 2103/30; H05K 1/0278; H05K 1/028; H05K 1/189
See application file for complete search history.

(56) References Cited

U.S. PATENT DOCUMENTS

| | | | | |
|---|---|---|---|---|
| 4,439,818 A | * | 3/1984 | Scheib ................ | F21V 21/0808 362/221 |
| 5,255,155 A | * | 10/1993 | Sugimoto ........... | B60R 16/0239 174/254 |
| 5,495,076 A | * | 2/1996 | Davis .................. | B60R 16/0215 174/250 |
| 5,717,556 A | * | 2/1998 | Yanagida ............. | H05K 1/0278 174/254 |

(Continued)

FOREIGN PATENT DOCUMENTS

| | | |
|---|---|---|
| DE | 202007018552 U1 | 10/2008 |
| DE | 102014213561 A1 | 1/2015 |
| KR | 20110041958 A | 4/2011 |

OTHER PUBLICATIONS

Guangzhou Yanglin Electronic Company Guangzhou 2835 SMD New S-shape flexible 2835 led strip manufacture.

(Continued)

*Primary Examiner* — Alan B Cariaso
(74) *Attorney, Agent, or Firm* — Peter T. DiMauro; Global Patent Operation

(57) ABSTRACT

Provided is a system for mounting electrical components thereon. The system includes an elongated printed circuit board (PCB) configured for coupling a plurality of electrical components thereto. The elongated PCB includes (i) one segment having a first width and (ii) another segment having a second width different than the first width. The other segment is bendable along multiple axes.

4 Claims, 7 Drawing Sheets

(56) References Cited

U.S. PATENT DOCUMENTS

| | | | | |
|---|---|---|---|---|
| 6,299,337 | B1* | 10/2001 | Bachl | F21S 48/215 257/E25.028 |
| 8,093,502 | B2* | 1/2012 | Mikado | H05K 1/0281 174/254 |
| 8,619,211 | B2 | 12/2013 | Bertram | |
| 8,820,965 | B2* | 9/2014 | McNabb | F21V 21/00 362/249.02 |
| 8,840,271 | B2* | 9/2014 | Otterson | H05K 1/0278 362/249.02 |
| 8,853,549 | B2* | 10/2014 | Kato | H05K 1/0281 156/308.2 |
| 9,109,776 | B2* | 8/2015 | Smith | F21V 5/04 |
| 9,113,558 | B2* | 8/2015 | Baik | H05K 1/0278 |
| 9,402,307 | B2* | 7/2016 | Otsubo | H05K 3/4691 |
| 9,410,665 | B2* | 8/2016 | Lind | G09F 13/0404 |
| 2003/0070483 | A1* | 4/2003 | Mueller | G01C 19/5783 73/493 |
| 2003/0071581 | A1* | 4/2003 | Panagotacos | F21V 5/04 315/185 R |
| 2003/0112627 | A1* | 6/2003 | Deese | F21V 21/0832 362/249.01 |
| 2012/0217520 | A1 | 8/2012 | Baik | |
| 2012/0243212 | A1* | 9/2012 | Smith | H05K 1/028 362/183 |
| 2014/0091335 | A1 | 4/2014 | Satake et al. | |
| 2014/0247595 | A1* | 9/2014 | Lind | G09F 13/0404 362/249.04 |
| 2014/0268779 | A1 | 9/2014 | Sorensen | |
| 2014/0340826 | A1* | 11/2014 | Shen | G06F 1/1666 361/679.15 |
| 2015/0189753 | A1* | 7/2015 | Goyal | H05K 1/0283 361/803 |
| 2015/0211698 | A1* | 7/2015 | Yeh | F21S 4/008 362/612 |
| 2015/0354797 | A1* | 12/2015 | Luo | H05K 1/028 362/223 |
| 2016/0327222 | A1* | 11/2016 | Rudisill | F21S 2/005 |

OTHER PUBLICATIONS

Abnormal shape letters/signs Bend Freely S-Shape flexible 24V/12V 2835 SMD LED waterproof rope light wholesale.

Rishang provides professional solution in LED signage, LED modules, LED light box, LED strip, LED rigid bar, LED power supply.

European Search Report and Opinion issued in connection with corresponding European Application No. 16185865.9 dated Feb. 1, 2017.

* cited by examiner

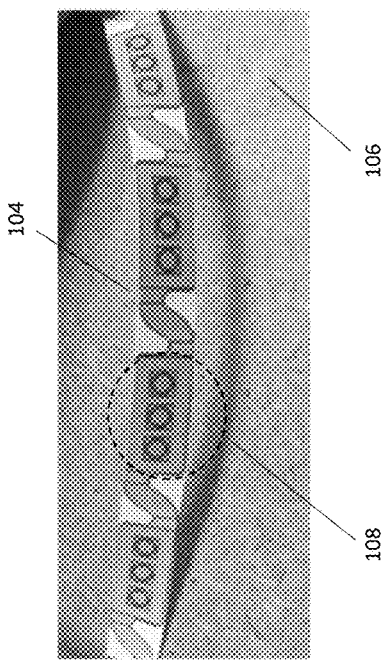
FIG. 1B
(conventional)
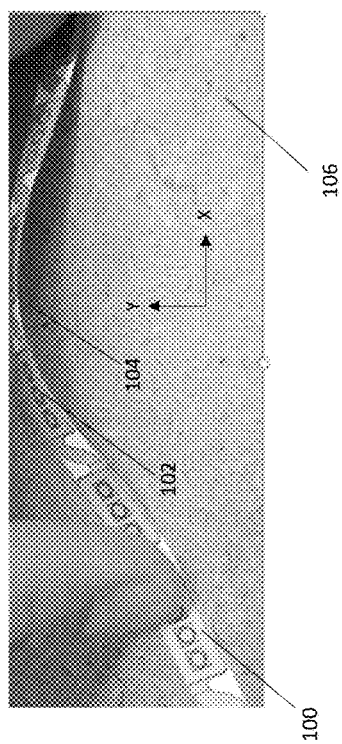
FIG. 1A
(conventional)

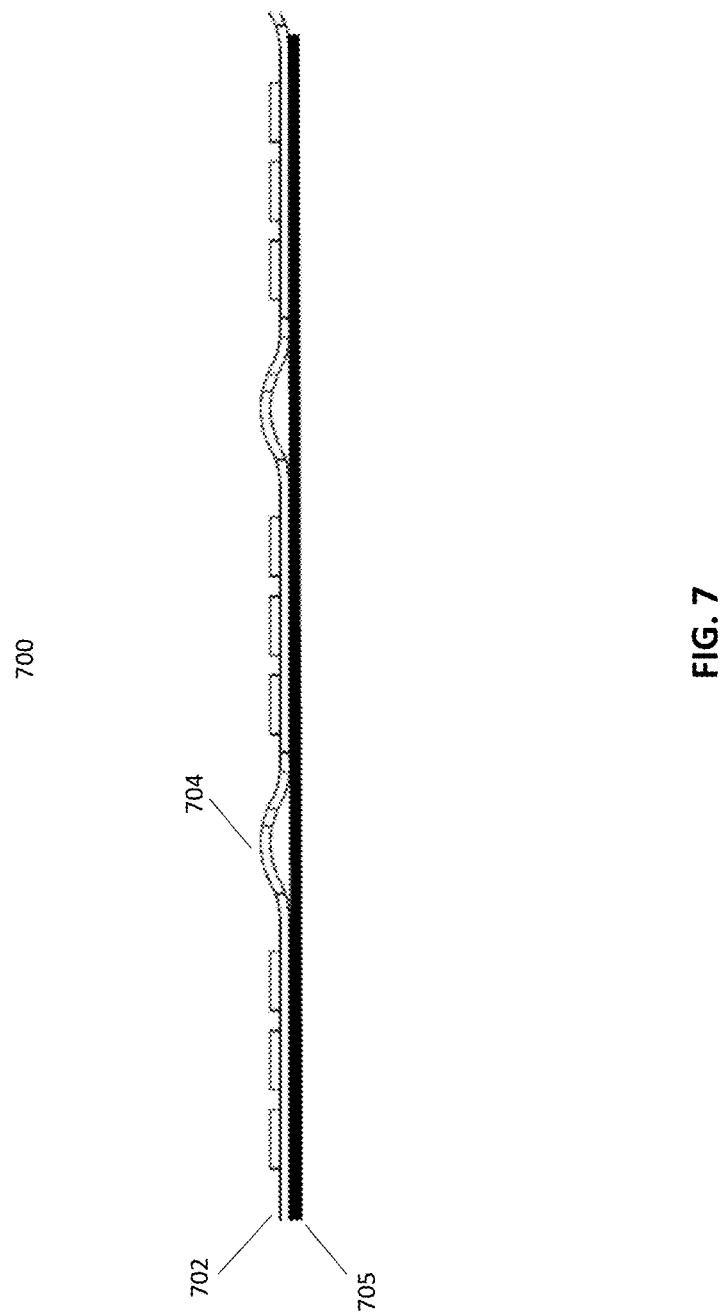

METHOD AND SYSTEM FOR A THREE-DIMENSIONAL (3-D) FLEXIBLE LIGHT EMITTING DIODE (LED) BAR

FIELD OF THE INVENTION

The present in generally relates to light emitting diodes (LEDs). Particularly, the present invention relates to electrical component printed circuit boards (PCBs).

BACKGROUND OF THE INVENTION

LEDs are commonly used in nearly all environments and applications requiring traditional lighting. In fact, LEDs are now more readily accepted as general lighting sources and viable replacements for traditional lighting technologies such as incandescent and fluorescent technologies etc. For example, LEDs are routinely used as replacements for neon lighting systems, and in purely aesthetic applications, such as building exterior accent lighting designs.

Many factors contribute to the increased usage of LEDs, such as higher energy savings, better quality lighting design, extended operating life, along with many others. One limitation, however, continuing to restrict the use of LEDs, especially an aesthetic applications, is the rigidity of many LED lighting designs. For example, traditional LED lighting designs have limited utility in contour applications because of a lack of flexibility and inability to bend along multiple axes.

One conventional LED design includes LED strips formed of flexible PCBs (FPCs). In these conventional designs, LEDs are mounted atop a flexible PCB, then overlaid with other structural component to create a linear path. For example, the resulting flexible LED strip can be viewed as a flexible ruler, bendable up and down along a single axis. This ruler (i.e., flexible strip), however, cannot be easily bent from side to side. As such, this particular flexible LED strip is only bendable along a single axis.

Thus, conventional flexible LED strips might be suitable as accent lighting bending around a corner of a building's exterior façade. This conventional flexible LED strip, however, is suboptimal when required to also twist down an edge or the corner of the building, or follow more complex curves.

To be suitable for the flexing on an agile corner of the building, or deforming to provide more complex curves, this conventional flexible LED strip would need to be twisted in some way, or cut into small pieces. Thus, these conventional LED strips are suitable in this aesthetic application only when it's required to flex or deform along a single axis.

Other conventional approaches include groups of two LED modules mounted on a small but relatively rigid PCB strip. In addition to the two LED modules, each of these PCB strips includes additional electronics. A single wire, or a bundle of twisted wires, interconnects each of the modules and are pre-shaped in three-dimension (3-D) to provide multi-access flexibility. The PCB strip, LEDs, and other electronics are placed into a mold and covered with silicon in a final manufacturing stage. As understood by those of skill in the art, these other conventional approaches can add significant expense and complexity to the PCB strip and the LED module design.

SUMMARY

Given the aforementioned deficiencies, a need exists for methods and systems that provide a PCB strip capable of accommodating electronic components, such as LEDs, with multi-axis flexibility. The embodiments featured herein help mitigate at least the above-noted deficiencies.

Under certain circumstances, embodiments of the present invention include a system for mounting electrical components thereon. The system includes an elongated FPC configured for coupling a plurality of electrical components thereto. The elongated PCB includes (i) one segment having a first width and (ii) another segment having a second width different than the first width. The other segment is bendable along multiple axes.

The embodiments described herein provide techniques to design 3-D PCB strips that are flexible, along multiple axes. In accordance with at least one of the illustrious embodiments, a PCB can be pre-shaped into a 3-D configuration, flexible along multiple axes. Electronic components, such as LEDs, can be mounted atop this 3-D flexible PCB strip. In a subsequent manufacturing step, silicon can be molded over top of the 3-D flexible PCB strip.

Additional features, modes of operations, advantages, and other aspects of various embodiments are described below with reference to the accompanying drawings. It is noted that the present disclosure is not limited to the specific embodiments described herein. These embodiments are presented for illustrative purposes only. Additional embodiments, or modifications of the embodiments disclosed, will be readily apparent to persons skilled in the relevant art(s) based on the teachings provided.

BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various drawings. The drawings are only for purposes of illustrating the embodiments and are not to be construed as limiting the disclosure. Given the following enabling description of the drawings, the novel aspects of the present disclosure should become evident to a person of ordinary skill in the relevant art(s).

FIGS. 1A and 1B are illustrations of a conventional rectangular PCB strip bendable along a single axis.

FIG. 7 is an illustration of a flexible strip constructed in accordance with an alternative embodiment of the present invention.

DETAILED DESCRIPTION OF EMBODIMENTS OF THE INVENTION

Figure 2:
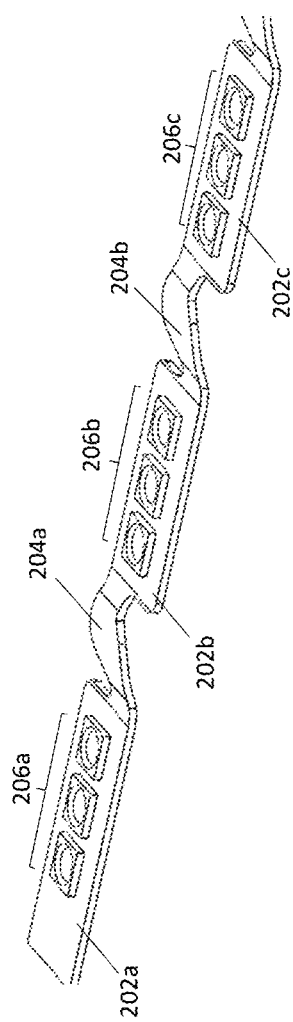
FIG. 2 is an illustration of a flexible PCB strip constructed in accordance with an embodiment of the present invention.

While the illustrative embodiments are described herein for particular applications, it should be understood that the present disclosure is not limited thereto. Those skilled in the art and with access to the teachings provided herein will recognize additional applications, modifications, and embodiments within the scope thereof and additional fields in which the present disclosure FIG. 1A is an illustration of a conventional rectangular PCB strip 100 having a top portion 102 for mounting electronic components, such as LEDs, thereto. The rectangular PCB strip 100 also includes a bottom portion 104 for connection to a device. In FIG. 1A, the PCB strip 100 is positioned atop an installation surface 106. The PCB strip 100 is only bendable up and down, along a single axis (e.g., Y direction).

FIG. 1B is an illustration of the conventional PCB strip 100 of FIG. 1A, shown from a different perspective. As depicted in FIG. 1B, the PCB strip 100 includes a mounting portion 108 for mounting the LEDs. Also as shown, the rectangular PCB strip 100 is formed of a uni-width construction. That is, all sections of the PCB strip 100 have the same width.

The rectangular, uni-width construction of the PCB strip 100 only permits bending in a single direction, along the Y axis. The PCB strip 100 cannot bend or flex from side to side. For example, forcing the PCB strip 100 to bend in a direction other than up and down results in the bottom portion 104 detaching from the installation surface 106. Additionally, LEDs coupled to the mounting portion 108 will be mis-aligned, and can no longer point in the proper direction.

Embodiments of the present invention provide an elongated thin flexible PCB strip that includes multiple segments. A first set of segments are wider than a second set of segments. The first set of segments are for mounting LEDs and other electronic components.

In accordance with the embodiments, the narrow segments are formed to facilitate multi-axis flexibility. That is, the flexible PCB strips, described herein, are bendable in the narrow segments, along multiple axes (i.e., in multiple directions). These flexible PCB strips are configured for pre-shaping in 3-D, within the narrow segments, to resemble a variety of different shapes (e.g., S-shaped).

FIG. 2 is an illustration of a flexible PCB assembly 200 constructed in accordance with an embodiment of the present invention. The PCB assembly 200 is formed of two different types of segments. The PCB assembly 200 includes wide PCB segments 202a-c, each including a respective one of regions (i.e., allocated surface) 206a-c. The wide PCB segments 202a-c are also flat. The regions 206a-c, contained within the respective segments 202a-c, are provided for coupling of electrical components, such as LEDs. That is, LEDs and other electronic components are connected to and mounted within the regions 206a-c, and other portions of the wide PCB segments 202a-c.

Figure 3:
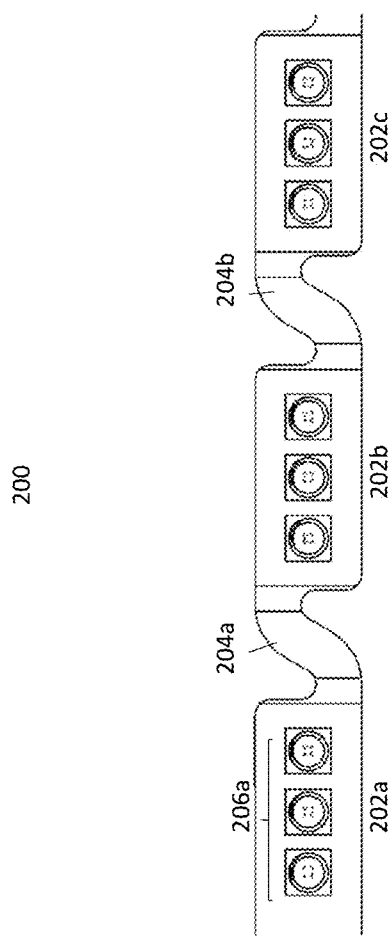
FIG. 3 is an illustration of a top view of the flexible PCB strip shown in FIG. 2.

The PCB assembly 200 also includes narrow PCB segments 204a-b. The narrow PCB segments 204a-b are configured to enable the PCB assembly 200 to twist and bend along multiple axes. By way of example, as illustrated in FIG. 3, the narrow segments 204a-b are S-shaped. As noted above, although the narrow segments 204a-b are depicted as being S-shaped in FIG. 3, other shapes are within the spirit and scope of the present invention.

Figure 4:
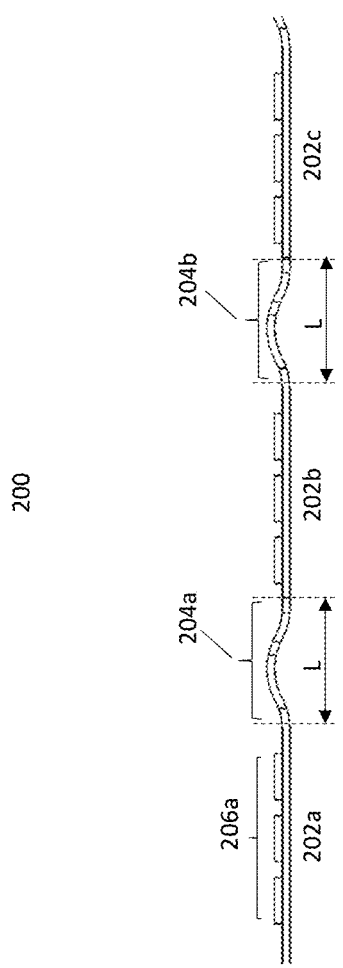
FIG. 4 is an illustration of a side view of the flexible PCB strip shown in FIG. 2.

FIG. 4 is an illustration of a side view of the flexible PCB strip 200 shown in FIG. 2. As shown in FIG. 4, the narrow segments 204a-b, having a length (L), and are positioned such that the bending and flexing occurs at least one wavelength away from the plane of the PCB of the wide PCB segments 202a-c. The narrow segments 204a-b enable the PCB assembly 200 to flex (i.e., bend, twist, and rotate) in any direction. This flexing concept is illustrated more clearly in FIGS. 5 and 6.

Figure 5:
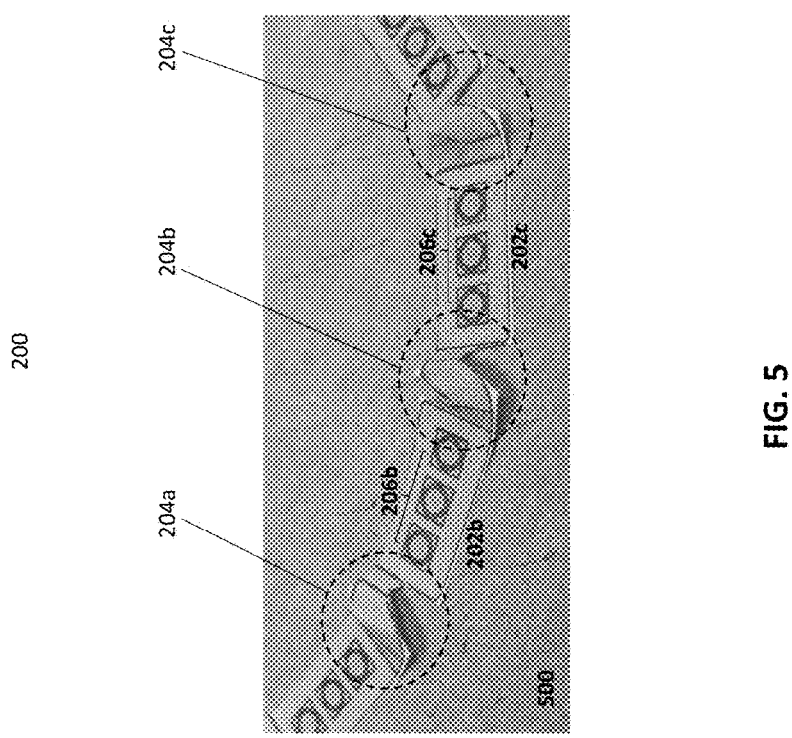
FIG. 5 is a more detailed illustration of flexing in the narrow segments of the flexible PCB strip shown in FIG. 2.

FIG. 5 is a more detailed illustration of flexing in narrow segments 204a-c of the flexible PCB assembly 200 shown in FIG. 2. In FIG. 5, the PCB assembly 200 includes the wide segments 202a-c mounted in predetermined positions. In FIG. 5, since the PCB assembly 200 only flexes in the narrow segments 204a-c, back portions (not shown) of the wide segments 202b and 202c, containing electronic component regions 206a and 206b, remain flat and affixed to an installation surface 500 in their predetermined positions.

Figure 6:
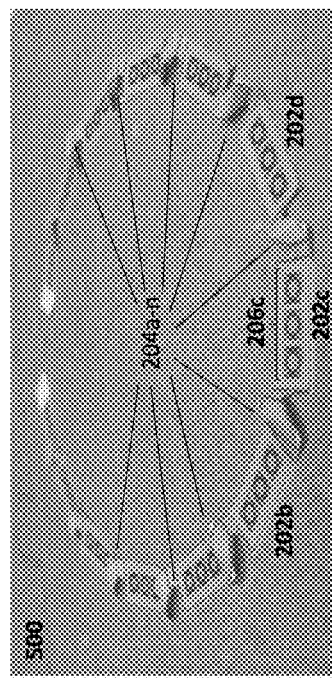
FIG. 6 is a more complete illustration of the narrow segments of the flexible PCB strip shown in FIG. 5.

FIG. 6 is a more complete illustration of narrow segments 204a-n of the flexible PCB assembly 200 shown in FIG. 5. In FIG. 6, the PCB assembly 200 is depicted bending, flexing, and rotating only within the narrow segments 204a-n. As a result, LEDs mounted within regions 206 of wide segments 202b-d remain aligned as originally intended. In a final manufacturing process, the PCB assembly 200 can be protected via over-molding, with materials such as silicon, to form a continuous flexible LED tube.

FIG. 7 is an illustration of a flexible PCB assembly 700 constructed in accordance with a second embodiment of the present invention. The PCB assembly 700 includes a portion similar to the PCB strip 200 in FIG. 4. For example, the PCB assembly 700 includes wide PCB segments 702 and narrow PCB segments 704, which are analogous to segments 202 and 204 in FIG. 4. The PCB assembly 700, however, includes a rigid wire 705 substantially straight along the LED strip to maintain the wave in place when the LED strip is stretch. The rigid wire 705 can be soldered directly below the position where the LEDs are mounted. In this manner, the rigid wire 705 enforces the overall structure of the flexible PCB assembly 700.

The illustrious embodiment of FIG. 7, enables the PCB assembly 700 to retain its state of deformation when folded. For example, once the assembly 700 is over-molded with silicone, if one end of the silicon tube is folded, the sections (i.e., links) in the folded shape will stretch and retain their deformed shape.

Additionally, the rigid wire 705 can also provide an alternative negative contact for the PCB assembly 700. In the embodiment of FIG. 7, for example, positive current can be applied to a top surface of the PCB, and the negative current will be channeled into the wire 705. By way of comparison, the PCB assemblies 200 and 700 are similar, with a primary difference being the addition of the rigid wire 705. The FPC can be either single layer (e.g., Copper trace on top) as well as Double layer (e.g., Copper trace on top and bottom)

In another illustrious embodiment, a nonflexible very thin PCB strip can be used. For example, a FR4 (fiberglass) variant thin strip (e.g., on order of 002 inches), with laminated copper, could be used in place of the PCB assemblies 200 and 700 discussed above. Using this approach, the flexibility is derived from the thinness of its design.

Those skilled in the relevant art(s) will appreciate that various adaptations and modifications of the embodiments described above can be configured without departing from the scope and spirit of the disclosure. Therefore, it is to be understood that, within the scope of the appended claims, the teachings of the present disclosure may be practiced other than as specifically described herein.

What is claimed:

1. A system for mounting light emitting diodes (LEDs) thereon, comprising:
    an elongated printed circuit board (PCB) configured for coupling a plurality of LEDs thereto;
    wherein the elongated PCB includes (i) a first segment having a first width and (ii) a second segment having a second width different than the first width, wherein the first width is wider than the second width; and wherein the plurality of LEDS are mounted on a top portion of the first segment;

wherein the PCB is only deformable along multiple axes within the second segment;

wherein the system further comprises a rigid wire disposed along a bottom portion of the elongated PCB to maintain in place when the system is stretched, the rigid wire configured to provide an electrical current contact for the elongated PCB.

2. The system according to claim 1, wherein the wire is soldered below the position where the LEDs are mounted.

3. The system according to claim 1, wherein the wire is a rigid wire disposed substantially straight along the elongated PCB to maintain in place when the system is stretched.

4. The system according to claim 1, wherein the second segment is S-shaped along a first axis.

* * * * *